United States Patent
Kosugi

[11] Patent Number: 5,500,556
[45] Date of Patent: Mar. 19, 1996

[54] PACKAGING STRUCTURE FOR MICROWAVE CIRCUIT

[75] Inventor: Yuhei Kosugi, Tokyo, Japan

[73] Assignee: NEC Corporation, Tokyo, Japan

[21] Appl. No.: 273,116

[22] Filed: Jul. 11, 1994

[30] Foreign Application Priority Data

Jul. 12, 1993 [JP] Japan ................................. 5-171725

[51] Int. Cl.$^6$ ................................................. H01L 23/24
[52] U.S. Cl. ........................... 257/718; 257/728; 257/727
[58] Field of Search ................................... 257/726, 727, 257/728, 719, 718, 720, 691

[56] References Cited

U.S. PATENT DOCUMENTS

| | | | |
|---|---|---|---|
| 4,729,060 | 3/1988 | Yamomoto et al. | 257/719 |
| 5,065,280 | 11/1991 | Karnezos et al. | 257/727 |
| 5,247,425 | 9/1993 | Takahasi | 257/727 |
| 5,345,107 | 9/1994 | Daikoku et al. | 257/719 |

FOREIGN PATENT DOCUMENTS 60-21611  2/1985  Japan .
60-64503  4/1985  Japan .

Primary Examiner—Sara W. Crane
Assistant Examiner—S. V. Clark

[57] ABSTRACT

A packaging structure for a microwave circuit having excellent heat radiation and obviating an intricate and large-sized shielding case is provided, the packaging structure comprising a circuit module accommodating internally a semiconductor element and a mother substrate 10; the circuit module 1 having two grounding conductor layers, a center conductor layer inserted therebetween, center conductor electrodes connected to the center conductor, grounding conductor electrodes disposed in the vicinity thereof, on one of its surfaces, and a thermal spreading plate connected to the other surface; the mother substrate 10 having two grounding conductor layers, a center conductor layer inserted therebetween, center conductor electrodes, grounding electrodes disposed on one of its surfaces, wherein the circuit module and the mother substrate are bonded so as to have the mutual electrodes joined directly facing with each other; a heat conductive elastomer is inserted between the thermal spreading plate and a heat radiating plate; and a pressure is applied to the mother substrate by means of a spring in order to bring the thermal spreading plate and the heat conductive elastomer to a close contact.

10 Claims, 7 Drawing Sheets

PACKAGING STRUCTURE FOR MICROWAVE CIRCUIT

BACKGROUND OF THE INVENTION

The present invention relates to a packaging structure for a microwave circuit, and more particularly to a packaging structure including a microwave circuit module or microwave IC module.

As well known, the wavelength of a microwave or millimeter wave region is short and, therefore, it is difficult to design a circuit arrangement including transmission lines while suppressing discontinuity on the lines to a low level and ensuring isolation between circuits or lines. Therefore, microwave circuit packaging has necessarily been intricate and costly. In recent years, a microwave monolithic integrated circuit (abbreviated as MMIC hereinafter) is becoming gradually applied as a semiconductor integrated circuits in the high frequency band. However, the MMIC has many drawbacks. For example, it is generally easy to crack so that many packaging restrictions exist. In particular, it is not adapted to integration of distributed constant circuits which tend to result in large sizes.

Referring to FIG. 8 showing a packaging structure for a conventional microwave circuit including an MMIC, an MIC module 101 having a circuit element 103, microwave leads 102 and bias supply terminals 107 therein are arranged on a main plate 100. Here, the microwave leads 102 and the bias supply terminals 107 are led to the rear side of the main plate 100 by going through outer conductive holes 109 formed therein. The bias supply terminals 107 are soldered via a printed circuit board or the like, and the microwave leads 102 are electrically connected to another module or an isolator 108 by soldering via the printed circuit board 104. The connected parts of the microwave leads 102 are shielded by means of a cover 106 isolated from the outside.

As shown in FIG. 8, since the MMIC's are unsuitable for integration of a distributed constant circuit constituted mainly of passive elements, active elements are sealed in an airtight case and connection between these active elements and the outside passive elements is established by microstrip lines and by soldering. Therefore, the sealing of the MMIC into an airtight case is costly, and an intricate and expensive shielding case having finely compartmentalized small chambers is required to prevent undesirable electrical connection between unit circuits. Further, the cost for assembling runs high.

Accordingly, the above-mentioned conventional packaging structure has the following defects. (1) A considerable cost has to be spent for building in an MMIC into an airtight case called a header. This is because the header itself is expensive and the assembling cost is high also. (2) An intricate and large-sized shielding case which is subdivided into small chambers is costly. (3) All of fixing of the header to the shielding case, fitting of the printed circuit board, soldering of the terminals, or the like, have to be done manually which result in a high assembling cost. (4) The structure has a large size and a large weight, and it has been a hindrance to miniaturization and reduction in weight of communication equipment.

SUMMARY OF THE INVENTION

It is therefore an object of the invention to provide a packaging structure for a microwave circuit having a small-sized and low cost. It is an another object of the invention to provide a packaging structure for a microwave circuit having excellent heat radiation efficiency. It is a further object of the invention to provide a packaging structure for a microwave circuit, which is exchangeable by circuit module unit. It is a further object of the invention to provide a package microwave circuit using the aforementioned packaging structure.

According to the present invention, there is provided a packaging structure for a microwave circuit, comprising a circuit module including a semiconductor circuit, a mother substrate accommodating the circuit module thereon, thermal spreading plate mounted on the circuit module for receiving heat from the circuit module, a radiator receiving the heat from the thermal spreading plate for radiating the heat, a heat conductive elastomer disposed between the thermal spreading plate and the radiator and spring means for pressing the mother substrate in the direction of the radiator.

DESCRIPTION OF EMBODIMENTS OF THE INVENTION

Figure 1:
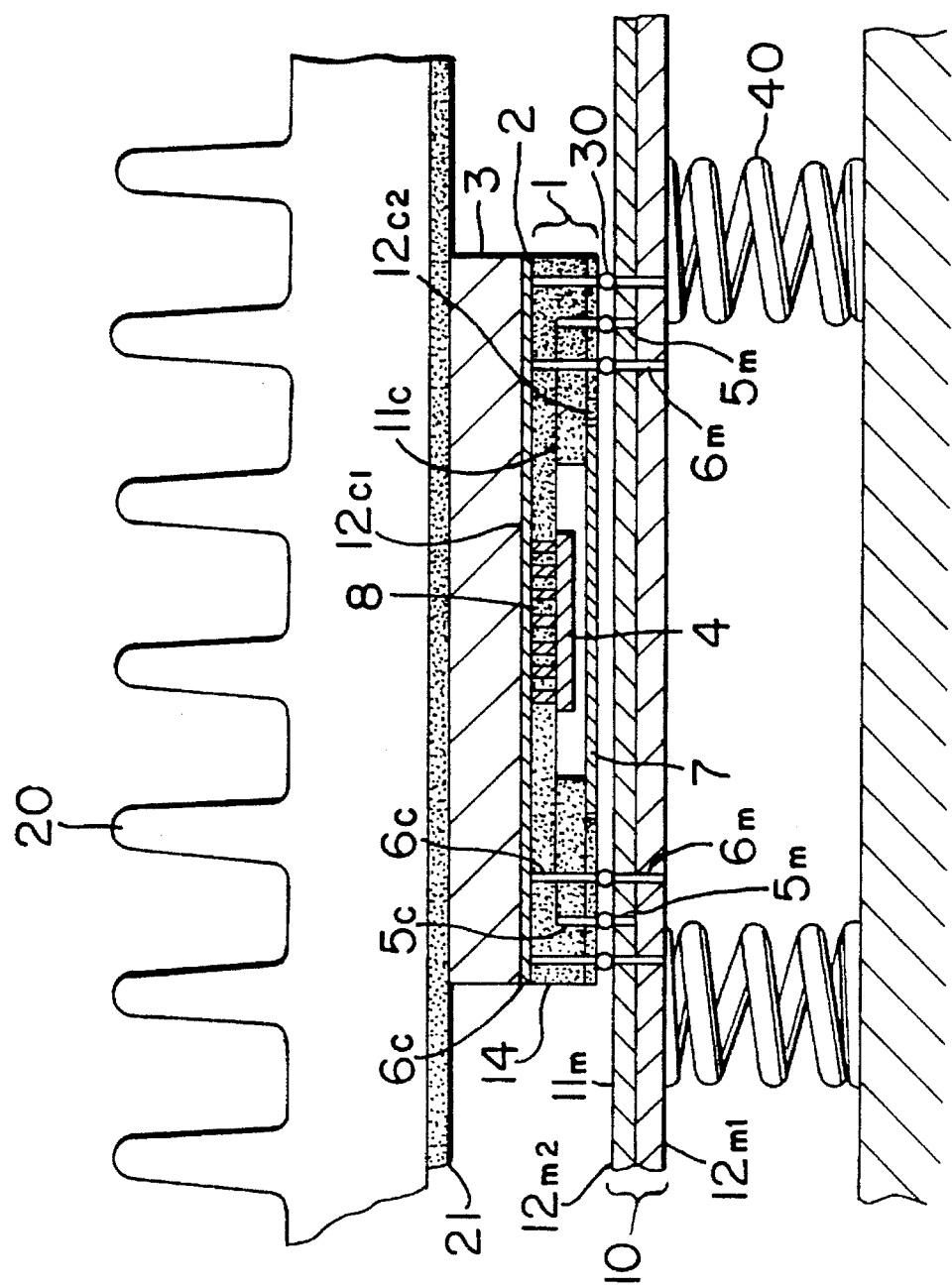
FIG. 1 shows a sectional view of a packing first embodiment according to the invention.

Referring to FIG. 1 showing a sectional view of the packaging structure for a microwave circuit according to a first embodiment of the invention, the description will proceed from that about the structure of various parts to that about the overall structure. In FIG. 1, a circuit module 1 accommodates at least one semiconductor element 4 having microwave circuits in its internal space. The circuit module 1 further has a multilayered structure 14 obtained by laminating dielectric layers and a conductor layer. In the embodiment, the structure 14 includes a center conductor layer $11_c$, dielectric layers and a pair grounding conductor layers $12_{c1}$ and $12_{c2}$ on the dielectric layers. The two grounding conductor layers $12_{c1}$ and $12_{c2}$ are mutually connected by grounding conductor vias (interlayer connecting conductors) $6_c$. The grounding conductor vias $6_c$ are provided in large number in the periphery of the circuit pattern formed on the center conductor where the disposing interval of the vias $6_c$ is designed to be less than ⅛ of the wavelength corresponding to the frequency processed in the circuit module 1. A signal is led out to a surface of the circuit module 1 by means of the center conductor vias $5_c$, and is connected to a surface electrode pattern having a bump 30 thereon. The grounding conductor vias $6_c$ are provided so as to surround the center conductor via $5_c$, and their tips are connected to grounding electrodes $6a$ (see FIG. 2) on the surface. Heat conductive vias 8 are provided to release heat generated by the semiconductor element 4. The generated heat runs off to a thermal spreading plate 3 through the vias 8 having excellent heat conductivity. The heat conductive vias 8 are made of Cu/W or Ag composition material. The semiconductor element 4 is accommodated in the space within the circuit module 1, and is shielded by a lid 7 made of a good electrical conductor. The thermal spreading plate 3 is fixed by a bonding material 2 to the circuit module surface where the semiconductor element 4 is installed.

Next, a mother substrate 10 will be described. The mother substrate 10 is formed of a flexible organic material, and it is possible to constitute a larger scale circuit unit by using a large-sized substrate 10 with a plurality of circuit modules 1. The mother substrate 10 has at least two grounding conductor layers $12_{m1}$ and $12_{m2}$ and a center conductor layer $11_m$ therebetween. In order to confine a microwave signal into the interior of the substrate 10, there are provided a large number of grounding conductor vias $6_m$, which connect with the upper and lower external conductors, in the periphery of the center conductor $11_m$. The grounding conductor vias $6_m$ need be provided to surround at least the circuit pattern of the center conductor $11_m$ and ideally, it is to be provided allover the surface of parts where the center conductor pattern is not found to confine the microwave signal perfectly. In this way, energy of the microwave signal is confined to the periphery of the center conductor layer $11_m$.

For the circuit module 1, analogous to the case of the mother substrate 10, a large number of the grounding conductor vias $6_c$ connecting the grounding conductor layers $12_{c1}$ and $12_{c2}$ are provided arround the circuit pattern of the center conductor layer $11_c$ and, if possible, the other allover part where the circuit pattern of the center conductor layer $11_c$ does not exist.

Figure 2A:
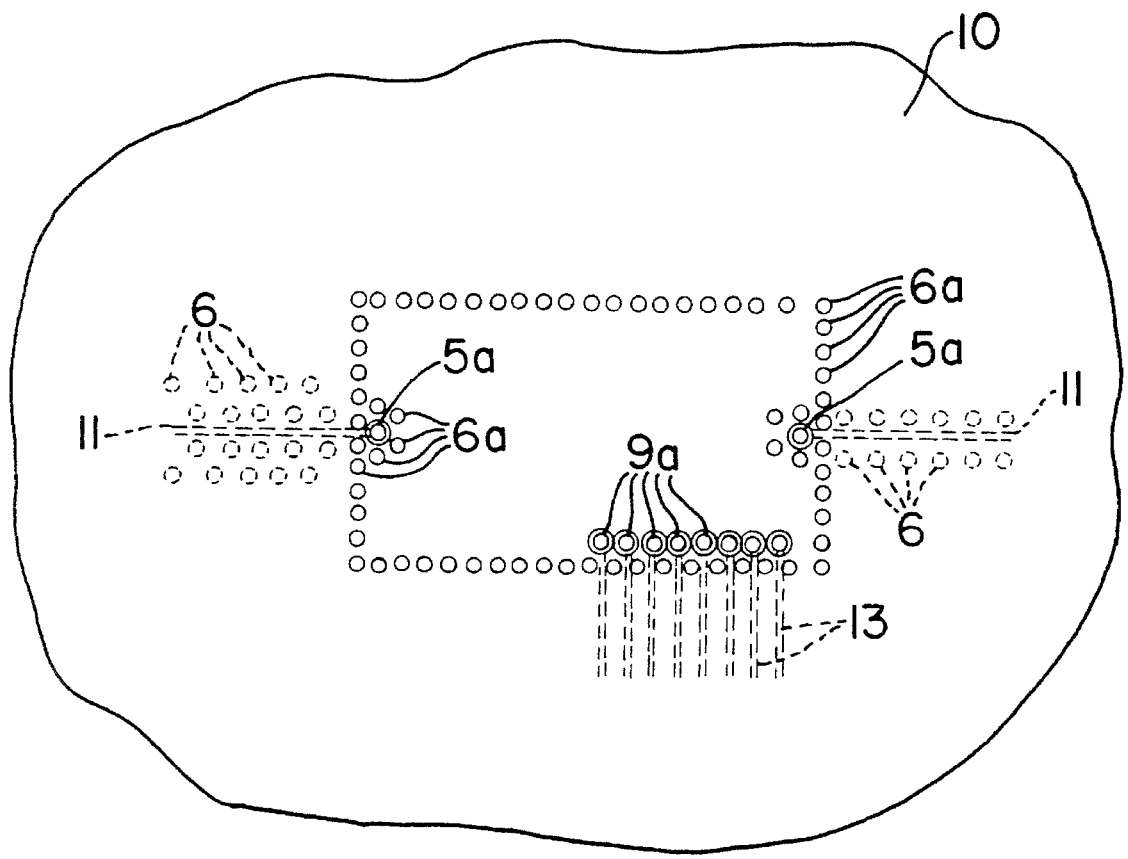
FIGS. 2 (A) and 2 (B) show electrode arrangements on a mother substrate and on a circuit module, respectively, in the embodiment shown in FIG. 1.
Figure 2B:
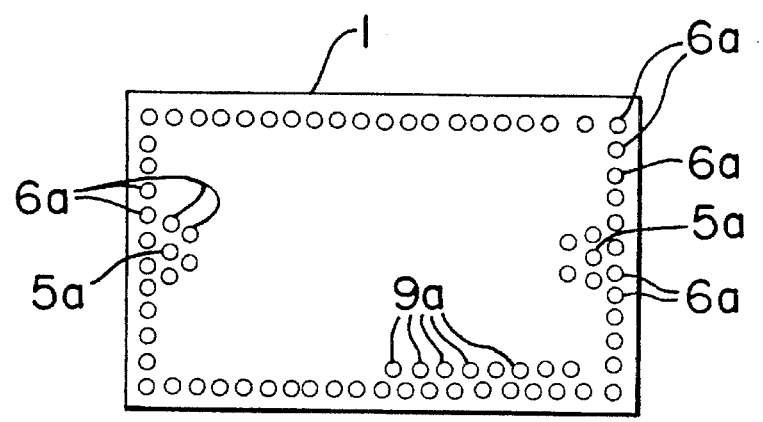

Further, electrode arrangements of the mother substrate 10 and the circuit module 1 will be described. In FIG. 2(A) showing the electrode arrangement of the mother substrate 10, the grounding conductor layer $12_{m2}$ has exceptional non-grounding conductive parts, i.e., the electrodes $5a$ and $9a$ for an input/output signal and a DC bias/low frequency signal, respectively. Further, the allover surface except for grounding electrodes $6a$ and the electrodes $5a$ and $9a$ is resisted. The electrodes $6a$, $5a$ and $9a$ connect with the respective vias. As the same as the vias $6_m$, the grounding electrodes $6a$ are arranged not only around the electrodes $5a$ for the center conductor layer but also in the periphery of the circuit module 1, at least. In this figure, dot lines 11 and 13 indicate the input/output signal lines and the bias/low frequency signal lines, respectively. As shown in FIG. 2(B), the surface of the circuit module 1 has grounding electrodes $6a$ and signal electrodes $5a$ and $9a$, which connect with the respective electrodes $6a$, $5a$ and $9a$ on the mother substrate 10 through the bumps 30 (FIG. 1). In this connection, it is possible to provide the bump 30 on the electrodes of the mother substrate 10 instead of the provision on the electrodes of the circuit module 1. Accordingly, since the microwave signals are confined to the interior of the circuit module 1 and the mother substrate 10 as in the above, there is no need of providing an intricate shielding case as is required in the conventional microwave circuits, and it is possible to realize a large-scale microwave circuit with a compact structure.

Next, cooling for the microwave circuit structure according to this invention will be described. In FIG. 1, heat generated from the semiconductor element 4 has to be discharged effectively to the outside of the equipment. A method which is generally employed for such a purpose is to use radiating fins. Such radiating structure is disclosed in, for example, Japanese Laid-open Patent Applications No. 60-21611 (1985) and No. 60-64503 (1985). However, it is impossible to apply this radiating structure for a packaged microwave circuit device. Further, the method is applicable only to a cooling system of external air intake type, and cannot be applied to closed type equipment. If a heat radiating plate is attached directly to the thermal spreading plate, heat can be taken directly to the outside through the thermal diffusion plate. However, it is impossible to closely attach mechanically a plurality of circuit modules to the heat spreading plate. This is because it is difficult to make the top surface of the thermal spreading plate flat with high precision (to be on the same plane) for all of the circuit modules due to difference in the size of soldering or the like. Moreover, if the heat radiating plate is fixed to the thermal spreading plate, then a stress is applied to bonded electrode parts of the circuit module and the mother substrate due to the difference between thermal expansion coefficients of the mother substrate and the heat radiating plate, causing damages to the bonded parts.

Figure 3A:
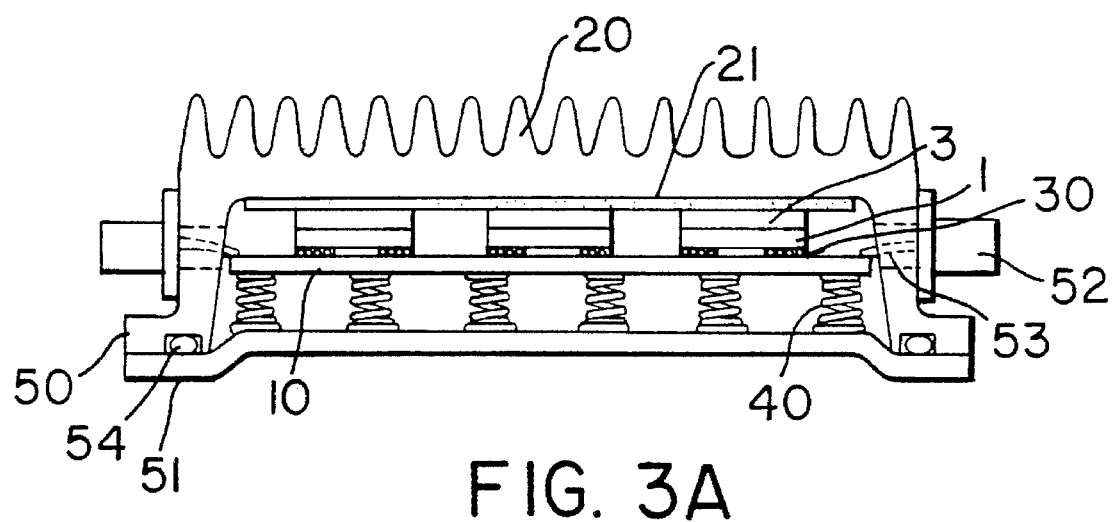
FIG. 3 is a sectional view of a package microwave circuit device to which the packaging structure shown in FIG. 1 is applied.
Figure 3B:
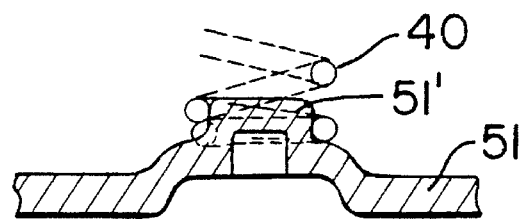

In this embodiment of the invention, a heat conductive elastomer 21 is inserted between the thermal spreading plate 3 and the heat radiating plate 20, and a pressure is applied to the mother substrate 10 by means of a spring 40 so as to bring the thermal spreading plate 3 and the heat conductive elastomer 21 to a close contact. With this arrangement, even if there was unevenness in the height of the top surface of the thermal spreading plate 3 with a plurality of circuit modules attached thereto, such an unevenness can be absorbed by the heat conductive elastomer 21. The heat conductive elastomer 21 is made of silicon resin and AlN, for example. Now, the thermal conductivity of heat conductive elastomers is generally not high compared with that of metals. Nevertheless, the disadvantage that the conductivity of the heat conductive elastomers is low will not cause a problem in practice because of spreading of heat generated by the semiconductor element to a broad area by means of the thermal diffusion plate. FIG. 3 shows a packaged microwave circuit device using the packaging structure of the invention. In this figure, three circuit modules 1 are contained and radiating plate 20 is directly formed on a device body. The body and a lid 51 compose of an airtight case 50. An input/output signal and a DC source are applied or derived through a connector 52. Numeral 53 indicates a connector terminal connecting with a conductor line on the mother substrate 10 and numeral 54 an O ring. A plurality of springs 40 are installed on the lid 51 through holders 51'. By assembling the lid 51 to the body, the springs 40 press the mother substrate 10 and, thus, the thermal spreading plate 3 is pressed to the radiating plate through the heat conductive elastomer 21. Therefore, heat generated from the circuit module 1 is efficiently discharged through the thermal spreading plate 3, the heat conductive elastomer 21 and the radiating plate 3, without any stress to the elements. In this case, the connector terminal 53 has elasticity and, therefore, the connection between the connector terminal 53 and the conductor line becomes completed when the springs 40 press the mother substrate 10.

The springs 40 may be provided one for each circuit element, and may be added more as need arises. When the circuit scale is small, the number of the springs 40 may be decreased. Further, there is no restriction on the type of the spring; it may be selected appropriately from among a coil spring, leaf spring, plastic foam, or the like, which can exert the pressure to the mother substrate.

Figure 4:
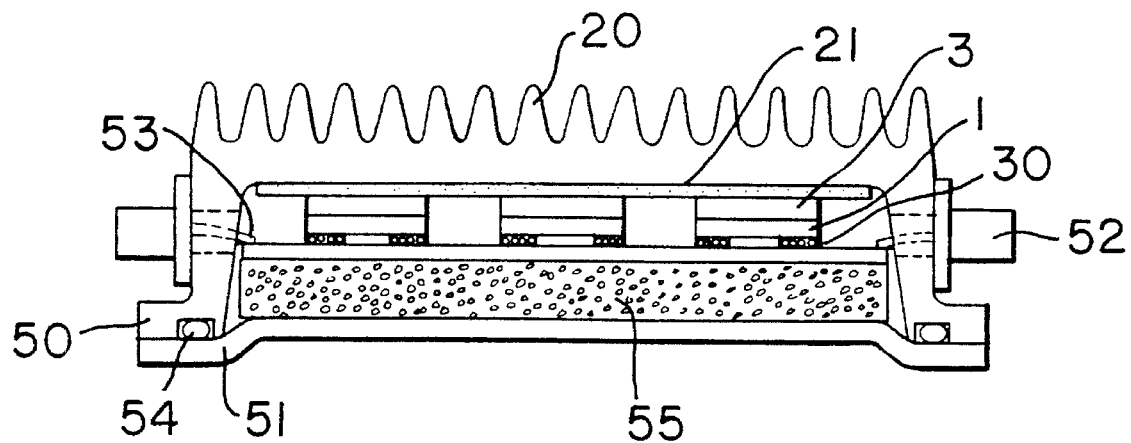
FIG. 4 is a sectional view of another packaged microwave circuit device to which a second embodiment is applied.
Figure 5:
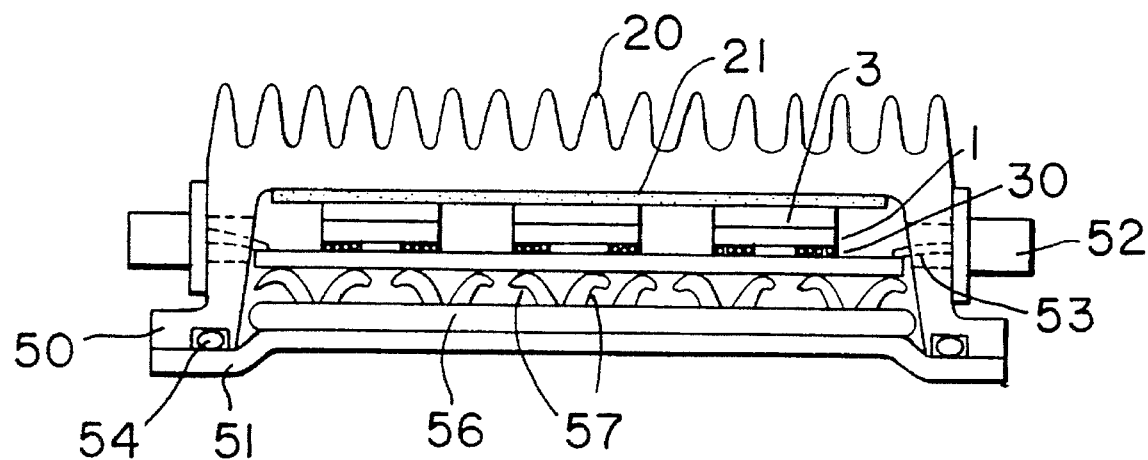
FIG. 5 is a sectional view of a further packaged microwave circuit device to which a third embodiment is applied.

FIG. 4 shows another packaged microwave circuit device utilizing a plastic sponge form 55 having a spring function, instead of the coil springs 40 in FIG. 3. The plastic sponge form 55 has an advantage to equally provide pressure to the mother substrate. FIG. 5 shows a further packaged microwave circuit device utilizing a plurality of leaf springs 57. Numeral 56 indicates a base plate. In this case, it is possible and advantageous to produce the leaf spring 57 together with the base plate 57 by plastic-molding. Since the purpose of applying pressure is to bring the thermal spreading plate in close contact with the heat conductive elastomer, it is possible to apply the pressure by utilizing elasticity of the mother substrate, resulting no-use of a spring. In that case, the structure can be made simpler than in the case of providing spring means separately, but there is required a rigorous design about the deformation amount (warping) of the mother substrate.

Figure 6:
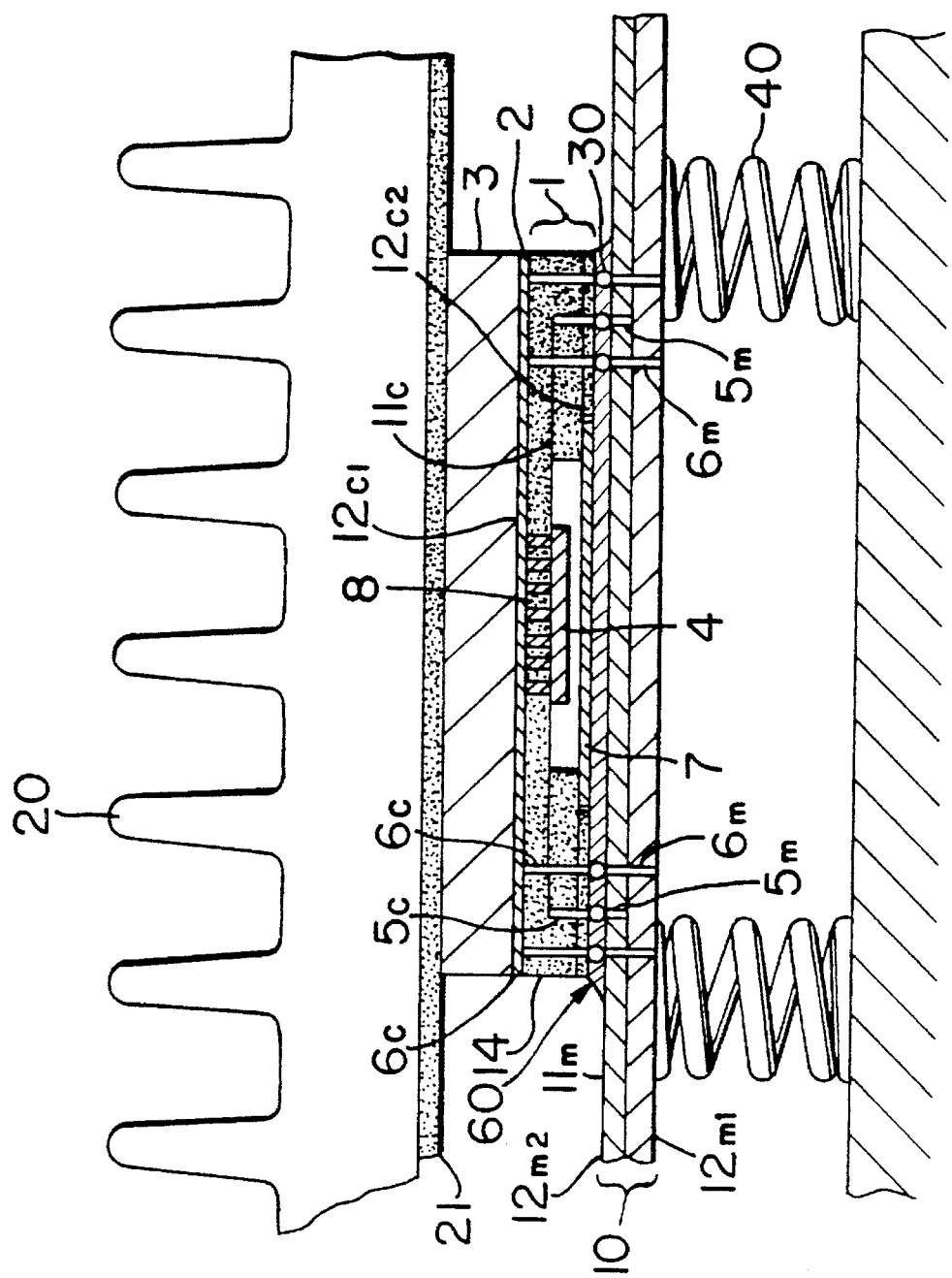
FIG. 6 shows a sectional view of a packaging structure according to a fourth embodiment.

The mother substrate is made of a organic material such as a epoxy-glass plate since elastic characteristic is essential to the mother substrate. In this connection, the circuit module may be made of the organic material as the same as the substrate. On the other hand, it is, of course, possible to apply a ceramic material to produce the circuit module. In the case applying the ceramic material, it is necessary to consider a difference of heat expansion between the organic material (mother substrate) and the ceramic material (circuit module). Since the heat expansion ratio is different between the organic and ceramic materials, shearing stress due to temperature change is applied to the bump and the bump becomes distroyed if the stress is in excess of tolerance. The tolerance is dependent on the size of the circuit module. Therefore, when the size of the circuit module is large and temperature is varied in a wide range, it is preferable to inject a resin material between the circuit module and the mother substrate to avoid that the stress concentrates on the bump. FIG. 6 shows this arrangement in which the resin 60 is provided.

Figure 7:
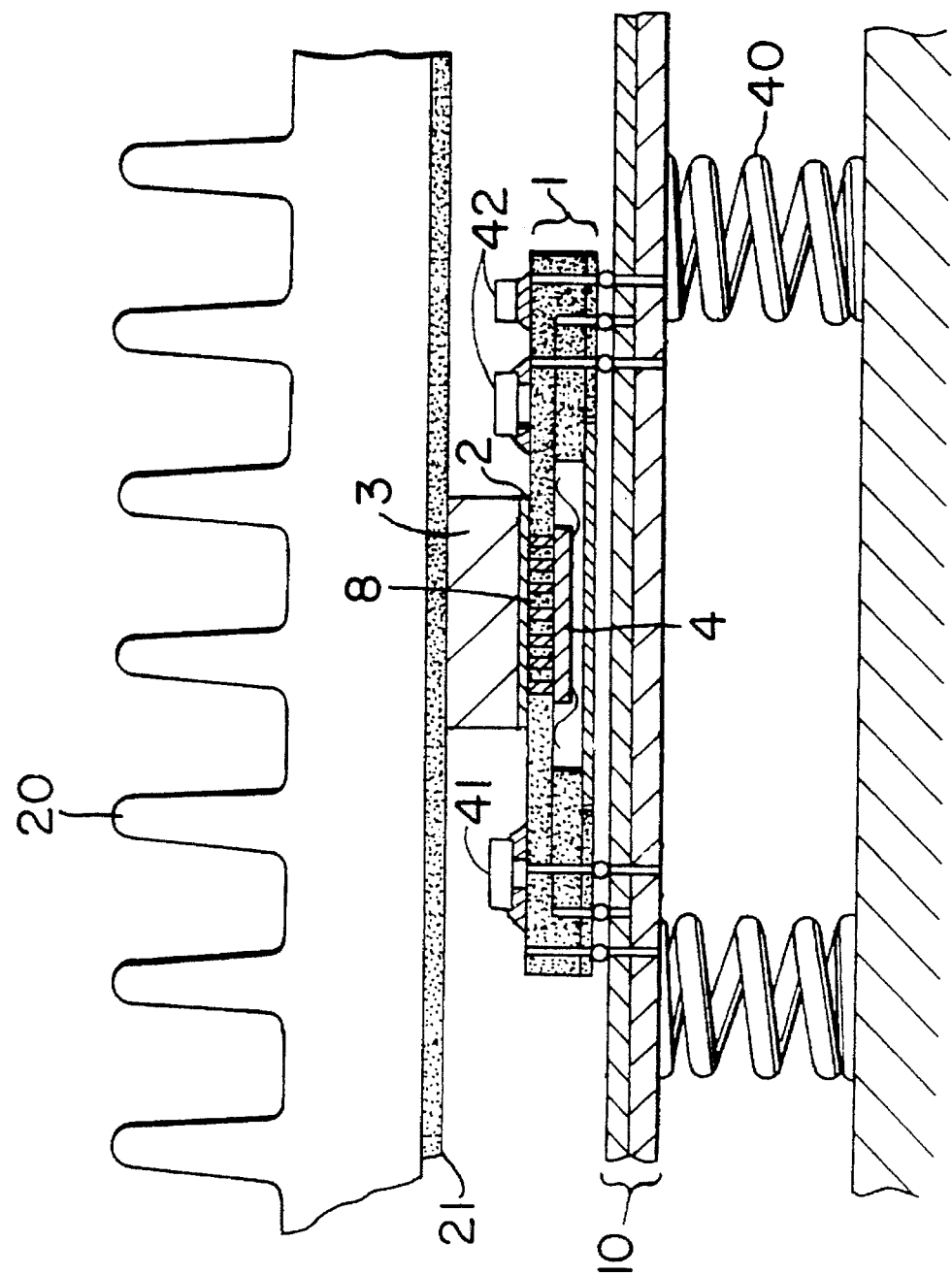
FIG. 7 shows a sectional view of a package structure according to a fifth embodiment.
Figure 8:
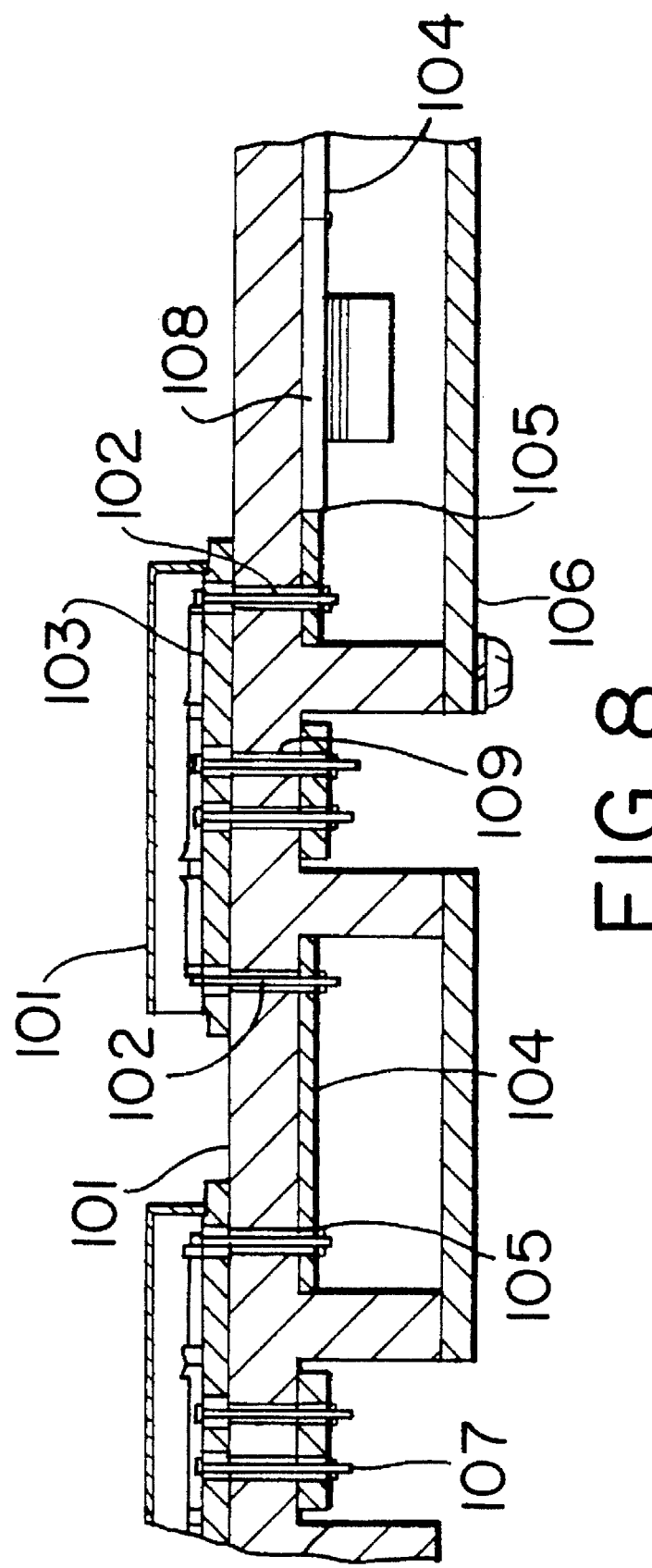
FIG. 8 shows a conventional packaging structure of a microwave circuit.

Various modifications to the packaging structures for a microwave circuit according to the invention can be thought of. When it is necessary to build an external capacitor with large capacitance or a low frequency semiconductor chip in the circuit module, these components are installed on the surface of the circuit module according to the surface packaging system. A packaging mode in that case is shown in FIG. 7 as a fifth embodiment. The thermal spreading plate 3 is limited only to the part of the surface of the circuit module 1 which is in the rear of the part where the semiconductor element 4 is installed, and a chip active element 41 and chip passive elements 42 are installed on the remaining parts of the surface. In this case, care should be exercised as much as possible so as not to reduce the area of the thermal spreading plate 3.

As described in the above, in the packaging structure for a microwave circuit according to this invention, microwave signals are confined into the interior of the circuit module and the mother substrate, without a shielding case which is intricate and large as well as expensive. In addition, by constructing a whole circuit by the circuit module which accommodates active elements consisting mainly of a semiconductor integrated circuit, and the mother substrate loaded with a plurality of the circuit modules, whose main function is mutual connection or integration, standardization of the circuit module as a unit became possible, and improvement of reliability and cost reduction are brought about by the mass production effect of the modules. Moreover, yield is also enhanced since replacement by the unit of module becomes feasible even when defective circuit modules are found.

Furthermore, according to this invention, heat generated by the semiconductor element accommodated in the circuit module is dispersed by the thermal spreading plate, and is let out by being directly transmitted to the heat radiating plate of the device via the heat conductive elastomer. Accordingly, the temperature of the semiconductor element can be lowered and its life can be prolonged. Or, conversely, it is possible to extract the highest available output from the semiconductor element. For the case of the mother substrate having a plurality of circuit modules thereon, even when it is difficult to obtain perfect flatness (identity of the plane) of the top surface of the thermal spreading plate, resulting in the occurrence of unevenness, the heat conductive elastomer absorbs slight errors so that excellent thermal conduction can be ensured.

As described in the above, the configuration of this invention can be simplified to such an extreme extent that it is possible to achieve a remarkable cost reduction compared with the conventional packaging structure.

What is claimed is:

1. A packaging structure for a microwave circuit comprising:

a circuit module having a semiconductor element;

a mother substrate accommodating said circuit module thereon;

thermal spreading means mounted on said circuit module for receiving heat from said circuit module;

radiating means receiving heat from said thermal spreading means for radiating said heat;

a heat conductive elastomer disposed between said thermal spreading means and said radiating means; and means for pressing said mother substrate in the direction of said radiating means, wherein said circuit module includes:

a multilayered substrate accommodating said semiconductor element thereon, said multilayered substrate having two first grounding conductive layers and a first center conductive layer between said two first grounding conductive layers, said first center conductive layer having a first connecting line pattern, a first center conductive via for leading said first connecting line pattern to a surface of a said circuit module, and a plurality of first grounding conductive vias connecting said two first grounding conductive layers, said plurality of first grounding conductive vias being arranged around said first center conductive via and around said semiconductor element.

2. A packaging structure as claimed in claim 1, wherein said mother substrate includes:

two second grounding conductive layers and a second center conductive layer between said two second grounding conductive layers, said second center conductive layer having a second connecting line pattern, and a plurality of second grounding conductive vias connecting said two second grounding conductive layers, said plurality of second grounding conductive vias being arranged around said second connecting line pattern and at places associated with said first grounding conductive vias.

3. A packaging structure as claimed in claim 1, wherein said multilayered substrate has a heat conducting via for transferring heat generated from said semiconductor element to said thermal spreading means.

4. A packaging structure as claimed in claim 1, wherein said pressing means comprises a coil spring.

5. A packaging structure as claimed in claim 1, wherein said pressing means comprises a leaf spring.

6. A packaging structure as claimed in claim 1, wherein said pressing means comprises a plastic sponge form.

7. A packaging structure as claimed in claim 2, further comprising bump means to join said first center conductive via and said first grounding conductive vias to said second center conductive via and said second grounding conductive vias, respectively.

8. A packaging structure as claimed in claim 7, further comprising a resin material injected between said circuit module and said mother substrate.

9. A packaging structure as claim 1, further comprising a circuit element, said circuit element being mounted on said circuit module together with said thermal spreading means.

10. A packaging structure as claimed in claim 1, further comprising:

a package for enclosing said circuit module, said mother substrate, said thermal spreading means, said heat conductive elastomer and said pressing means, said package being jointed to said radiating means; and a connector having a terminal which connects a conductive line on said mother substrate to an external line, said connector being arranged to said package, wherein electric connection between said terminal and said conductive line is ensured while said pressing means presses said mother substrate in the direction of said radiating means.

* * * * *